United States Patent
Dewdney et al.

(10) Patent No.: US 7,348,773 B2
(45) Date of Patent: Mar. 25, 2008

(54) METHOD AND DEVICE FOR ASSESSING AMBIENT CONDITIONS OF AN INSTALLATION SITE OF A MAGNETIC RESONANCE IMAGING DEVICE

(75) Inventors: Andrew Dewdney, Erlangen (DE); Florian Steinmeyer, Herzogenaurach (DE)

(73) Assignee: Siemens Aktiegesellschaft, Munich (DE)

( * ) Notice: Subject to any disclaimer, the term of this patent is extended or adjusted under 35 U.S.C. 154(b) by 9 days.

(21) Appl. No.: 11/416,481

(22) Filed: May 2, 2006

(65) Prior Publication Data
US 2006/0244446 A1    Nov. 2, 2006

(30) Foreign Application Priority Data
May 2, 2005   (DE) ...................... 10 2005 020 375

(51) Int. Cl.
*G01V 3/00*        (2006.01)
(52) U.S. Cl. ...................... 324/300; 324/322

(58) Field of Classification Search ................ 324/300, 324/308, 317, 318, 322
See application file for complete search history.

(56) References Cited

U.S. PATENT DOCUMENTS

| | | | |
|---|---|---|---|
| 5,126,669 A * | 6/1992 | Honess et al. | 324/261 |
| 6,191,698 B1 * | 2/2001 | Hennig et al. | 340/686.6 |
| 6,774,624 B2 * | 8/2004 | Anderson et al. | 324/207.17 |
| 6,888,353 B1 * | 5/2005 | Wiegert | 324/345 |
| 2002/0039030 A1 * | 4/2002 | Khazei | 324/750 |

FOREIGN PATENT DOCUMENTS

DE     103 33 796 A1    11/2004

* cited by examiner

*Primary Examiner*—Louis M. Arana

(57) ABSTRACT

In a method for assessing ambient conditions of an installation site of a magnetic resonance imaging device, various places in an area surrounding the installation site are examined by means of a detection unit for changes in a test magnetic field and the ambient conditions are determined from the results of the examination. The detection unit includes a magnetic field generator and a magnetic field sensor.

18 Claims, 3 Drawing Sheets

METHOD AND DEVICE FOR ASSESSING AMBIENT CONDITIONS OF AN INSTALLATION SITE OF A MAGNETIC RESONANCE IMAGING DEVICE

CROSS REFERENCE TO RELATED APPLICATIONS

This application claims priority to the German Application No. 10 2005 020 375.2, filed May 2, 2005 which is incorporated by reference herein in its entirety.

FIELD OF INVENTION

The present invention relates to a method and device for assessing ambient conditions of an installation site of a magnetic resonance imaging device.

BACKGROUND OF INVENTION

Intense magnetic fields having a flux density of several teslas are employed in magnetic resonance imaging devices for examining patients. To achieve high resolutions during image generation the magnetic field within an imaging volume of the magnetic resonance imaging device needs to be as homogeneous as possible.

SUMMARY OF INVENTION

The magnets of magnetic resonance imaging devices are shielded to the maximum possible extent by means of special field neutralizing coils inside the magnet housing in order to reduce the magnet's leakage field. The leakage field outside the magnet is nevertheless still strong enough to magnetize, for example, ferromagnetic material in floors and structural walls (such as steel supports and iron concrete reinforcements). This gives rise to inhomogeneities in the magnetic resonance imaging device's imaging volume that adversely affect image generation. There are various ways to compensate said inhomogeneities, all covered by the term "shimming". The homogeneity of the magnetic field can be improved by placing ferromagnetic materials such as, for instance, iron inside the magnetic resonance imaging device in an arrangement accommodated to said device's respective location. This is referred to as passive shimming. Magnet coils can additionally be used for compensating the inhomogeneities that occur (active shimming). The time required for shimming and the complexity of the shim process correlate with the extent of the inhomogeneity of the magnetic field in the imaging volume.

Iron can be disposed around buildings in such a way that satisfactory homogeneity can only be achieved in the imaging volume after complex calculations, or not at all. It would therefore be desirable to ascertain the relevant information prior to installing an HF-shielded cabin required for operating the magnetic resonance imaging device and introducing the magnetic resonance imaging system. A location can then be confirmed at an early stage in planning operations, revised, or improved through structural measures. These include, for example, raising the floor (to increase the distance between the magnet and ferromagnetic parts), replacing ferromagnetic parts, or selectively attaching ferromagnetic parts at compensating places. The floor beneath the magnet is in practice generally of greatest significance because steel reinforcements are frequently employed there and their spatial proximity to the magnet results in far stronger influences than from walls or ceilings.

DE 103 33 796 A1 describes a method and a device for optimally determining an installation site for magnetic resonance imaging devices, with the ambient conditions of said installation site having to be assessed and the shim plates needed for shielding being calculated from the results. The device described includes a resistive magnet simulator which is positioned at the magnetic resonance imaging device's installation site and is briefly powered up to the expected magnetic field. The shielding characteristics and the repercussions on the magnet are determined by means of a plurality of local magnetic field sensors positioned in the area surrounding the magnet simulator and appropriate room planning or necessary shim measures are identified from this data.

One possibility for determining the influence of magnetizable material on the magnetic field of the magnetic resonance imaging device is to perform a calculation using finite element methods, with said influence being calculable taking account of the distribution of magnetizable material within the walls of a room. Calculations of said type are, though, extremely arduous or even unimplementable especially as the specific distribution of magnetizable material in the walls is generally unknown or building plans have not been followed precisely.

An object of the present invention is to disclose a method and a device to be used in conjunction therewith by means of both of which the assessing of ambient conditions of a magnetic resonance imaging device's installation site is enabled and an ensuing shimming process is simplified.

Said object is achieved by the claims, with various places in an area surrounding the installation site being examined by means of a detection unit to detect changes in a test magnetic field and the ambient conditions being determined therefrom, with said detection unit including a magnetic field generator and a magnetic field sensor and the examination of each of said places comprising the following method steps:

positioning the detection unit at the place,

Generating the test magnetic field by means of the magnetic field generator,

Detecting changes in the test magnetic field by means of the magnetic field sensor.

A decision about the installation site can be made based on the measurement data.

Owing to the generally uneven distribution of magnetizable material in the area surrounding an installation site that can potentially be used for the magnetic resonance imaging device it is to be assumed that inside the building the magnetizable material's influence on the magnetic resonance imaging device's magnetic field is not equally strong at all places in the building. The optimal place exhibiting the least influence on the magnetic field can be determined by examining one or more potentially usable rooms in a building and positioning the magnetic resonance imaging device accordingly, with only those places requiring to be examined in the building which are in any event potentially usable for positioning the magnetic resonance imaging device. In particular the floor's loading capacity and the size of the room are of crucial importance here. The method described has the advantage over calculating the influence of magnetizable material in the area surrounding the magnetic resonance imaging device that the magnetizable material's influence is measured directly at the specific places that can potentially be used for installing the magnetic resonance imaging device, with its being irrelevant how said influence has arisen so that the actual distribution of the magnetizable material in the surrounding area is itself of no interest. For subsequent shimming of the magnetic resonance imaging device it is crucial only for the influence to be as small as possible.

In an advantageous embodiment of the method the various places are selected in such a way as to at least partially cover the floor of the room. The more precisely the area of the room that will subsequently lie within range of the magnetic resonance imaging device's leakage field is examined, the more accurate the assessment will be.

In a particularly advantageous embodiment of the method the various places are arranged on the floor in a meandering form. The entire floor of the room can then be covered and examined along a simple line, with areas too close to the walls possibly being omitted.

In a particularly advantageous embodiment the detection unit automatically takes measurements at the various places in the room. Examining of the room can as a result be extensively automated and so take place speedily.

In an advantageous method an overview map of changes in the magnetic field in the at least one room is generated so that the area surrounding the installation site can easily be assessed.

The object with regard to the device is achieved by a detection unit comprising a magnetic field generator and a magnetic field sensor, wherein the detection unit is configured to determine ambient conditions based on the detected changes in the test magnetic field after the changes have been detected by the detection unit at a plurality of places.

An evaluation unit is to practical effect connected to the magnetic field sensor and embodied in such a way that it will generate the overview map automatically from the magnetic field sensor's measurements. The advantage of this is that external data evaluation devices can be dispensed with and the overview map can be read directly on the device.

In a preferred embodiment the detection unit includes at least one electromagnet as the magnetic field generator. The magnetic field strength can easily be set by way of a current. Electromagnets can be produced at an economic cost, moreover.

In a particularly advantageous embodiment the detection unit includes a magnetoresistive sensor as the magnetic field sensor. Said type of magnetic field sensor known per se is especially easy to produce as an electronic component. Via a circuit it feeds out a change in its resistance when there is a change in the magnetic field. It is a type of sensor that is particularly easy to read out using an electronic control means.

Further advantages of the invention will be explained with reference to the exemplary embodiment described below and in conjunction with the attached drawings, in which:

DETAILED DESCRIPTION OF INVENTION

Figure 1:
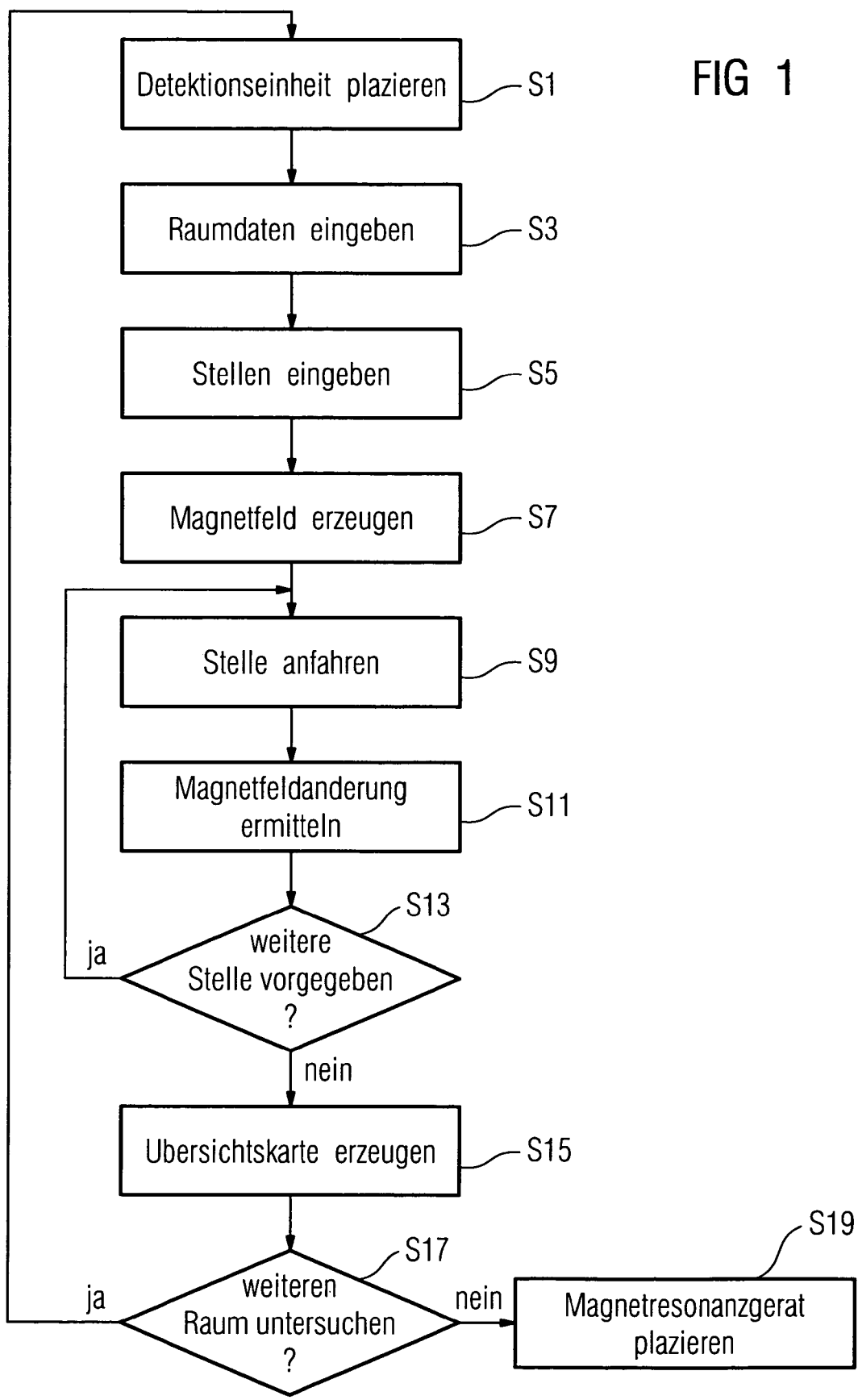
FIG. 1 is a schematic flowchart of a method for positioning a magnetic resonance imaging device.

FIG. 1 is a schematic flowchart of a method for positioning a magnetic resonance imaging device according to a preferred embodiment of the invention. In a first method step S1, a detection unit is positioned within a room required to be examined. The preferred installation site is preferably selected for this purpose. Data of the room requiring to be examined is entered in a second method step S3. In the present exemplary embodiment said data indicates the dimensions of the floor area (length and width) of the room requiring to be examined. The places that are to be examined are entered in a third method step S5. Because the magnetic resonance imaging device will generally need to be accessible from all sides, a minimum distance will have to be maintained from the respective room's walls when the installation site is selected. Places that are close to the walls will nonetheless still have to be examined as a function of the magnetic resonance imaging device's leakage field profile. As options, either individual places can be entered for examining or an area can be specified that will be examined by the detection unit stage by stage proceeding from said area's center point. In general, the entire floor area situated within the magnetic resonance imaging device's leakage field range will always be examined.

The method steps S3 and S5 are optional. Individual places in the room can thus also be examined manually, for example when the magnetic resonance imaging device can in any event only be positioned at one place in the room. In this case the detection unit will be positioned in the method step S1 at the place requiring to be examined and the method resumed from the method step S7, which is described below.

A magnetic field having a predefined magnetic field distribution is generated in a fourth method step S7. Said magnetic field distribution is in particular oriented on a measurement of the room's floor because the maximum influence is to be expected here owing to the minimum distance from the walls. With a suitably embodied detection unit it is, however, also possible to examine walls and ceilings. In a fifth method step S9 the detection unit is automatically moved to a first of the places entered. This step will be omitted if the detection unit is operated manually. Any change in the magnetic field will be determined in a sixth method step S11 by means of the magnetic field sensor and said change stored in an evaluation unit of the detection unit along with the corresponding place in the room. A check is carried out in a seventh method step S13 to determine if any more places have been specified. If so, a branch will be made back to the fifth method step S9 and the detection unit moved to the next place. A room can in this way be examined automatically stage by stage. For example, the detection unit can move spirally toward the walls proceeding from the center of the room as its starting point. The room can alternatively be examined in a meandering form. The path respectively traveled by the detection unit is stored and used for subsequent evaluating. If no other places have been specified, an overview map showing the changes in the room's magnetic field will be generated in an eighth method step S15 and shown on a display medium. The examined places or, as the case may be, the path traveled are/is used for generating the overview map and the corresponding measured values are shown for the distortion. The overview map can alternatively be stored and viewed at a later time on, for example, an external computer, and analyzed.

A user is asked in a ninth method step S17 whether any more rooms have to be examined. If so, said user will for this purpose be requested to position the detection unit in the relevant room and the method will start again. If no other rooms have been specified for examining then the magnetic resonance imaging device will be positioned in a tenth method step S19 at a place, displayed on the overview map, where the magnetic field is least influenced by magnetizable material. The magnetic resonance imaging device can also be positioned at another time when the rooms have been examined for the magnetizable material.

Figure 2:
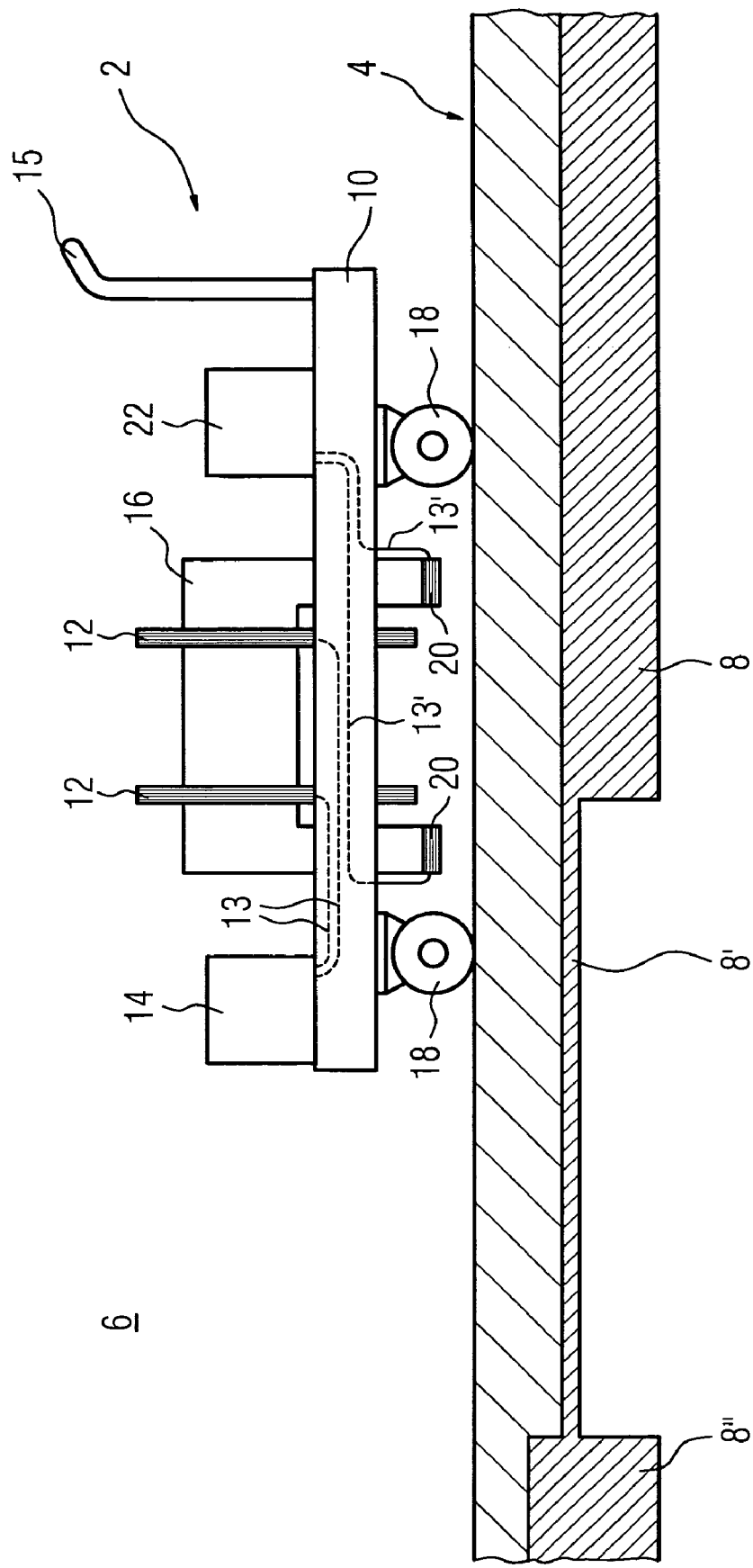
FIG. 2 is a schematic of a preferred embodiment of a detection unit.

FIG. 2 is a schematic of a detection unit 2 according to a preferred embodiment of the invention with a floor 4 of a room 6 being examined. The floor 4 contains iron supports 8, 8', and 8" of differing thickness. A magnetic resonance imaging device is to be positioned in the room 6. The task is to use the detection unit 2 to examine one or more places in the room 6 to determine the influence of said iron supports 8, 8', and 8" on a magnetic field. The walls and ceiling of the room 6 are not shown in FIG. 2. Any iron supports or other magnetizable material would likewise influence the magnetic field and be registered by the detection unit 2 analogously. As has already been explained, the influence due to the iron supports 8, 8', and 8" in the floor 4 of the room 6 will generally be the greatest. The detection unit 2 is embodied as a movable carriage 10 and, as a magnetic field generator, includes a pair of conventional excitation coils 12. Said excitation coils 12 are connected inside the carriage 10 via cables 13 to a control unit 14 via which they are supplied with power and generate a corresponding magnetic field. The excitation coils 12 are permeated by a horseshoe-shaped iron core 16 in order to amplify and concentrate the magnetic field toward the floor 4. As an alternative to using excitation coils 12 it is also possible only to use a permanent magnet. Another alternative is to use a superconducting magnet coil. The solution employing excitation coils 12 is to be preferred, though, since the magnetic field that is generated can be deactivated simply and, in contrast to a superconducting coil, requires no cooling. A plurality of magnets can alternatively also be used in order to achieve a required field distribution.

The carriage 10 further includes steerable wheels 18 that can be moved by known methods via a drive mechanism not shown here. Said drive mechanism is likewise connected to the control unit 14 so that various places in the room 6 can be moved to automatically via the control unit 14. The carriage is controlled in this exemplary embodiment according to principles of robotics that are known per se. For measuring changes in the magnetic field, the carriage 10 can alternatively be moved manually to the places in the room that are to be examined. The handle 15 is provided for said purpose.

Attached beneath the iron core 16 are two magnetic field sensors 20 whose function will be explained further below with the aid of FIGS. 4 and 5. The arrangement has therein been selected in such a way that the magnetic field sensors are located as close as possible to the floor and hence to the magnetizable material. The magnetic field sensors 20 are connected via cables 13' to an evaluation unit 22 that includes means for storing and displaying data. Signals from the magnetic field sensors 20 are registered thereby and evaluated according to the method shown in FIG. 1. Stored in the evaluation unit 22 for each magnetic field sensor 20 is a reference value representing a measured value of the respective magnetic field sensor 20 in a surrounding area without an external interference source.

The room 6 is examined by means of the detection unit 2 and an overview map of said room produced by the evaluation unit 22. Shown on said map is the influence of the iron supports 8, 8', and 8" on the magnetic field of the excitation coils 12. An assessment of the area surrounding the installation site can be read directly from the overview map. Said assessment may indicate also that the room concerned is more likely to be unsuitable for the magnetic resonance imaging device or, as the case may be, that shimming may entail extra effort. It can in that case be of practical advantage to examine any other rooms that can potentially be used.

Figure 3:
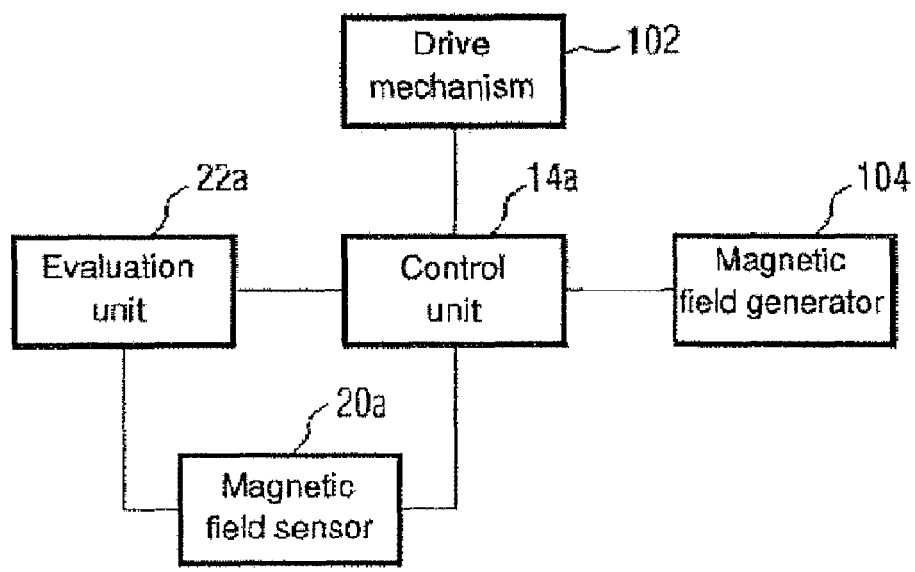
FIG. 3 is a block diagram of the detection unit.

FIG. 3 is a schematic block diagram of an interconnection of the units contained in the detection unit 2 and their interoperation. The control unit 14a is connected to the drive mechanism 102 and can move via said mechanism to the places in a room specified by a user. Likewise connected to the control unit 14a is a magnetic field generator 104 which generates the desired magnetic field. Said control unit 14a further serves to control the magnetic field sensor 20a whose data is registered by an evaluation unit 22a. Said evaluation unit 22a automatically generates the overview map from the data of the magnetic field sensor 20a. The evaluation unit 22a includes a display medium on which the overview map showing the influence of the magnetizable material is displayed to a user. The display medium serves simultaneously to interactively enter, for example, the room data and the specified places at which the magnetizable material's influence on the magnetic field is to be determined. These are preferably the places that can potentially be used for locating the magnetic resonance imaging device. The evaluation unit 22a is connected to the control unit, as a result of which the data entered by the user concerning the room size and places to be examined can be transmitted to the control unit.

The measured data can alternatively be evaluated at a later time on, for instance, an external computer. For transmitting the data the detection unit 2 contains a suitable interface, for example a USB port or Bluetooth connection. The control unit and evaluation unit can in an alternative embodiment also be combined in a single unit.

Various types of devices operating according to methods known per se can be used as the magnetic field sensor. They include, for example, a gradiometer coil which, when used, enables sensitivity to be increased using the known lock-in technique. A Hall probe, a fluxgate, or a SQUID system can be employed alternatively as the magnetic field sensor. Corresponding arrangements are commercially available and have been described in many places. Two other embodiments for the magnetic field sensor will be described below.

Figure 4:
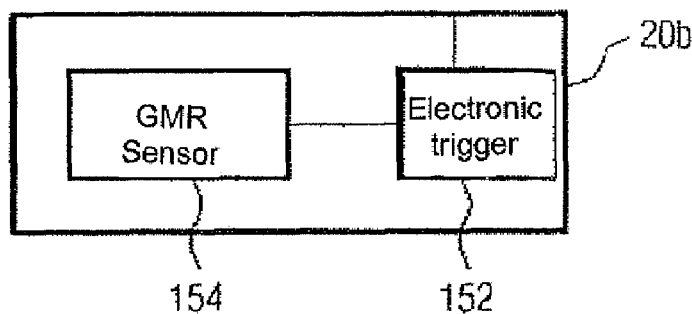
FIG. 4 shows an embodiment of a magnetic field sensor.

FIG. 4 shows an embodiment of the magnetic field sensor 20b. It includes an electronic triggering means 152 and a magnetoresistive sensor embodied as a GMR (Giant MagnetoResistance) sensor 154. Comparable GMR sensors are nowadays used in commonly found computer hard disks. The resistance of the GMR sensor 154 depends on the external magnetic field so that changes in the magnetic field can be simply determined using methods known per se. The GMR sensor 154 is connected to the electronic triggering means 152.

Figure 5:
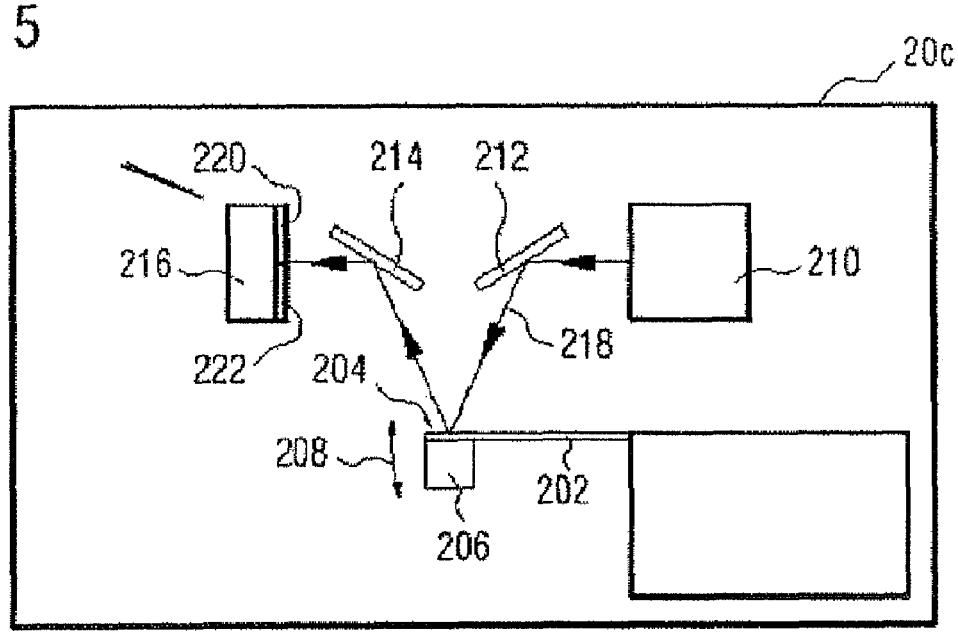
FIG. 5 shows an alternative embodiment of a magnetic field sensor.

FIG. 5 is a schematic of an alternative embodiment of the magnetic field sensor 20c. The magnetic field sensor 20c operates on a principle comparable to the scanning force microscope. It includes a cantilever 202 embodied as a flexible spring. A permanent magnet 206 of lowest possible mass is attached as the magnet element to a moving end 204 of the cantilever 202. The cantilever 202 will be displaced from its rest position under the influence of a magnetic field on the permanent magnet 206. A change in the magnetic field due to distortion by the magnetizable material in the floor will be accompanied by a change in the displacement of the cantilever 202, which is indicated by the double arrow 208. To register the displacement quantitatively, light is shone onto the rear of the cantilever 202 from a light source 210, for example a laser, via an adjustable tilted mirror 212. The rear of the cantilever 202 is embodied as mirrored so that the light is for the most part reflected. It is cast via another tilted mirror 214 onto a photodetector 216, which generates a voltage signal therefrom. The corresponding beam track is indicated by the line 218. The photodetector 216 includes a plurality of measuring fields 220 and 222 so that a movement of a point of light on the photodetector 216 is measurable. The point of light will migrate on the photodetector 216 when the cantilever 202 moves up or down owing to changes in the magnetic field. A change in the magnetic field can be quantitatively registered from the resulting change in the voltage signal of the measuring fields 220 and 222 of the photodetector 216. The cantilever 202 and permanent magnet 206 are preferably embodied having lowest possible mass so that any unevenness in the floor will not cause the cantilever 202 to vibrate owing to its inertia while the detection unit 2 is being moved and so falsify the measuring signal.

The invention claimed is:

1. A method of assessing ambient conditions of an installation site of a magnetic resonance imaging device, wherein a plurality of places within the installation site are examined using a detection unit for detecting changes in a test magnetic field, the detection unit comprising a magnetic field generator and a magnetic field sensor, the method comprising:
    positioning the detection unit at a first of the plurality of places;
    generating the test magnetic field by the magnetic field generator at the first place;
    detecting changes in the test magnetic field at the first place by the magnetic field sensor;
    repeating the method steps presented above for at least one further place of the plurality of places; and
    determining at least one location in at least one room of the installation site where the test magnetic field is least influenced by magnetizable material from the detected changes in the test magnetic field regarding the first and further places.

2. The method as claimed in claim 1, wherein the plurality of places include a floor of the room.

3. The method as claimed in claim 2, wherein the plurality of places are arranged on the floor and have a meander arrangement.

4. The method as claimed in claim 2, wherein the plurality of places are arranged on the floor and have a spiral arrangement.

5. The method as claimed in claim 2, further comprising generating an overview map representing the detected changes in the test magnetic field relative to a plurality of locations within the room.

6. The method as claimed in claim 1, wherein the detection unit is configured to automatically execute the generating of the test magnetic field and the detecting of the changes in the test magnetic field upon positioning the detection unit at the respective place.

7. A detection unit for generating a test magnetic field and for evaluating changes in the test magnetic field, comprising:
    a magnetic field generator for generating the test magnetic field; and
    a magnetic field sensor for detecting the changes in the test magnetic field, wherein the detection unit is configured to determine ambient conditions based on the detected changes in the test magnetic field after the changes have been detected by the detection unit at a plurality of places;
    wherein the magnetic field sensor comprises a cantilever having a movable end;
    and wherein the magnetic field sensor comprises a reflection unit for measuring a displacement of the movable end.

8. The detection unit as claimed in claim 7, further comprising an evaluation unit connected to the magnetic field sensor and configured to generate an overview map representing the detected changes in the test magnetic field relative to the plurality of places.

9. The detection unit as claimed in claim 7, further comprising:
    a plurality of wheels; and
    a drive mechanism connected to the wheels for moving the detection unit.

10. The detection unit as claimed in claim 9, further comprising a control unit connected to the drive mechanism for moving the detection unit to the plurality of places.

11. The detection unit as claimed in claim 10, wherein the control unit is connected to the magnetic field sensor for automatically executing the generating of the test magnetic field and the detecting of the changes in the test magnetic field upon positioning the detection unit at the respective place.

12. The detection unit as claimed in claim 7, wherein the magnetic field generator comprises at least one permanent magnet or electromagnet.

13. The detection unit as claimed in claim 7, wherein the magnetic field sensor is a flux gate.

14. The detection unit as claimed in claim 7, wherein the magnetic field sensor comprises a magnetoresistive sensor.

15. The detection unit as claimed in claim 7, wherein the magnetic field sensor includes a Hall probe.

16. The detection unit as claimed in claim 7, wherein the magnetic field sensor is a gradiometer for determining a gradient of the test magnetic field.

17. The detection unit as claimed in claim 7, further comprising a magnet element arranged on the movable end.

18. The detection unit as claimed in claim 7, wherein the reflection unit comprises a light source and a photodetector.

* * * * *